United States Patent
Shima et al.

(10) Patent No.: US 7,078,148 B2
(45) Date of Patent: Jul. 18, 2006

(54) RADIATION SENSITIVE RESIN COMPOSITION

(75) Inventors: Motoyuki Shima, Mie (JP); Hiroyuki Ishii, Mie (JP); Atsushi Nakamura, Mie (JP); Masafumi Yamamoto, Mie (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/446,824

(22) Filed: May 29, 2003

(65) Prior Publication Data

US 2004/0072094 A1    Apr. 15, 2004

(30) Foreign Application Priority Data

Jun. 3, 2002   (JP) .............................. 2002-162150

(51) Int. Cl.
*G03C 1/73* (2006.01)
*G03F 7/039* (2006.01)

(52) U.S. Cl. .................. 430/270.1; 430/921; 430/922; 430/919; 430/925; 430/905; 430/910; 430/326

(58) Field of Classification Search ............ 430/270.1, 430/286.1, 905, 910, 913, 914, 281.1
See application file for complete search history.

(56) References Cited

U.S. PATENT DOCUMENTS

| | | | |
|---|---|---|---|
| 4,910,122 A * | 3/1990 | Arnold et al. ............... | 430/313 |
| 6,057,080 A * | 5/2000 | Brunsvold et al. ......... | 430/273.1 |
| 6,180,316 B1 * | 1/2001 | Kajita et al. ............. | 430/270.1 |
| 6,753,124 B1 * | 6/2004 | Nishimura et al. ........ | 430/270.1 |
| 6,838,225 B1 * | 1/2005 | Nishimura et al. ........ | 430/270.1 |
| 2002/0009667 A1 * | 1/2002 | Nishimura et al. ........ | 430/270.1 |
| 2002/0132181 A1 * | 9/2002 | Nishimura et al. ........ | 430/270.1 |
| 2003/0203307 A1 * | 10/2003 | Soyano et al. ........... | 430/270.1 |

FOREIGN PATENT DOCUMENTS

| | | |
|---|---|---|
| JP | 59-93448 | 5/1984 |
| JP | 5-188598 | 7/1993 |

* cited by examiner

*Primary Examiner*—Sin Lee
(74) *Attorney, Agent, or Firm*—Merchant & Gould PC

(57) ABSTRACT

A radiation-sensitive resin composition comprising: (A) a resin comprising a hydroxyl group or carboxyl group, of which the hydrogen atom has been replaced by an acid-dissociable group possessing an alkali dissolution controlling capability, the resin increasing the solubility in an alkaline aqueous solution when the acid-dissociable group dissociates, and a photoacid generator comprising (B-1) a sulfonium salt represented by 1-(3,5-dimethyl-4-hydroxyphenyl)tetrahydrothiophenium perfluoro-n-octanesulfonate and 1-(4-n-butoxy-1-naphthyl)tetrahydrothiophenium nonafluoro-n-butanesulfonate and (B-2) a sulfonium salt represented by triphenylsulfonium nonafluoro-n-butanesulfonate. The radiation-sensitive resin composition useful as a novel chemically amplified resist exhibiting excellent sensitivity and resolution to deep ultraviolet rays typified by an ArF excimer laser, superior pattern shape-forming capability, and the like.

5 Claims, No Drawings

RADIATION SENSITIVE RESIN COMPOSITION

BACKGROUND OF THE INVENTION

1. Field of the Invention

The present invention relates to a radiation-sensitive resin composition and, more particularly, to a radiation-sensitive resin composition suitable as a chemically-amplified resist useful for microfabrication utilizing various types of radiation, for example, deep ultraviolet rays such as a KrF excimer laser, ArF excimer laser, or $F_2$ excimer laser, X-rays such as synchrotron radiation, or charged particle rays such as electron beams.

2. Description of Background Art

In the field of microfabrication represented by the manufacture of integrated circuit devices, lithographic technology enabling microfabrication with a line width of 0.20 μm or less has been demanded in order to increase the degree of integration in recent years.

In a conventional lithographic process, near ultraviolet rays such as i-line radiation have been generally used. However, it is difficult to perform microfabrication with a line width of sub-quarter micron using near ultraviolet rays.

Therefore, in order to enable microfabrication with a line width of 0.20 μm or less, utilization of radiation with a shorter wavelength has been studied. As examples of radiation with a shorter wavelength, deep ultraviolet rays represented by a line spectrum of a mercury lamp and an excimer laser, X-rays, electron beams, and the like can be given. Of these, a KrF excimer laser (wavelength: 248 nm), an ArF excimer laser (wavelength: 193 nm), and an $F_2$ excimer laser (wavelength: 157 nm) have attracted attention.

As a radiation-sensitive resin composition applicable to such an excimer laser radiation, a number of resists utilizing a chemical amplification effect between a component having an acid-dissociable functional group and a photoacid generator which generates an acid upon irradiation have been proposed. Such a resist is hereinafter called a chemically-amplified resist.

In such a chemically-amplified resist, a photoacid generator is known to greatly affect the functions of the resist. In these days, onium salt compounds which generate an acid upon irradiation at a high quantum yield and exhibit relatively high sensitivity are widely used as photoacid generators for chemically-amplified resists.

An onium salt compound used as a photoacid generator contains an onium cation and a counter anion. The structure of such an onium salt compound has been extensively studied. In particular, the onium cation is known not only to control the quantum efficiency of acid generation during irradiation, but also to affect the properties of the onium salt compound such as, for example, solubility in a solvent for resists, melting point, thermal decomposition temperature, chemical stability to various resist additives such as an acid diffusion controller, and affinity with a resin component for a resist. The onium cation thus greatly affects the functions of chemically amplified resists.

Onium salts of which the onium cation is a 4-hydroxyphenylsulfonium cation, 4-hydroxynaphthylsulfonium cation, or a derivative thereof absorb only a small amount of rays in the deep ultraviolet region typified by an ArF excimer laser. This enables the resist containing such an onium salt to exhibit high resolution and produce excellent rectangular resist patterns, but lowers the sensitivity of the resist. On the other hand, onium salts of which the onium cation is a triphenylsulfonium cation or its derivative can afford high sensitivity to the resist, but absorb a larger amount of rays in the deep ultraviolet region typified by an ArF excimer laser, disenabling the resist to exhibit high resolution.

In view of recent progress in microfabrication of semiconductor devices, development of a radiation-sensitive resin composition useful as a chemically amplified resist which is applicable to deep ultraviolet rays typified by an ArF excimer laser and exhibits excellent basic properties as a resist is an important subject.

An object of the present invention is to provide a novel radiation-sensitive resin composition useful as a chemically amplified resist exhibiting excellent sensitivity and resolution to deep ultraviolet rays typified by an ArF excimer laser, and superior basic properties as a resist such as producing a pattern shape.

SUMMARY OF THE INVENTION

Specifically, the present invention provides a radiation-sensitive resin composition comprising: (A) a resin comprising a hydroxyl group or carboxyl group, of which the hydrogen atom has been replaced by an acid-dissociable group possessing an alkali dissolution controlling capability, wherein the acid-dissociable group dissociates by the action of an acid generated by irradiation and increases the solubility of the resin in an alkaline aqueous solution and (B) a photoacid generator, which comprises a compound (B-1) shown by the following formula (1),

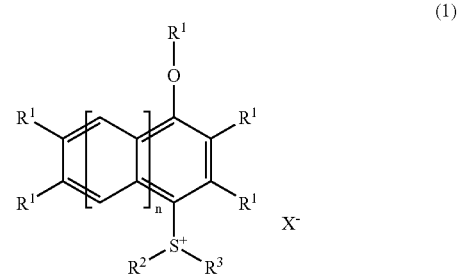

wherein the groups $R^1$ individually represent a hydrogen atom or a linear or branched alkyl group having 1–4 carbon atoms, n is 0 or 1, $R^2$ and $R^3$ individually represents a hydrogen atom, a linear or branched alkyl group having 1–4 carbon atoms, or $R^2$ and $R^3$ bond together with the sulfur atom in the formula to form a 3–6 member cyclic structure, and $X^-$ represents a substituted or unsubstituted, linear or branched fluoroalkylsulfonic acid anion having 1–15 carbon atoms or a disulfonylimide acid anion represented by the following formula (i),

wherein each $R^4$ groups individually represent a linear or branched fluoroalkyl group having 1–15 carbon atoms, and a compound (B-2) shown by the following formula (2),

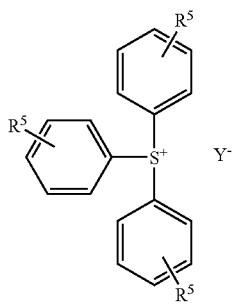

(2)

wherein the groups $R^5$ individually represent a hydrogen atom, a hydroxyl group or a derivative thereof, or a linear or branched alkyl group having 1–4 carbon atoms and $Y^-$ represents a substituted or unsubstituted, linear or branched fluoroalkyl sulfonic acid anion having 2–15 carbon atoms.

In a preferred embodiment of the radiation-sensitive resin composition of the present invention, the component (A) comprises (A-1) a recurring unit originating from a (meth)acrylate having an acid-dissociable group and (A-2) a recurring unit originating from a (meth)acrylate having a lactone structure.

In the radiation-sensitive resin composition of the present invention, the content of the component (B-2) is preferably 5–30 wt % of the component (B-1). In the radiation-sensitive resin composition of the present invention, the component (B-1) is preferably a compound having the $R^2$ and $R^3$ groups bonded with the sulfur atom in the formula (1) to form a tetrahydrothiophene ring.

In the radiation-sensitive resin composition of the present invention, the component (B-1) is preferably a compound having $C_4F_9SO_3^-$ or $C_8F_{17}SO_3^-$ for $X^-$ in the formula (1).

In the radiation-sensitive resin composition of the present invention, the component (B-2) is preferably a compound having $C_4F_9SO_3^-$ or $C_8F_{17}SO_3^-$ for $Y^-$ in the formula (2).

In the radiation-sensitive resin composition of the present invention, the acid-dissociable group in the component (A) is preferably a compound of the following formula (3):

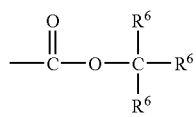

(3)

wherein $R^6$ individually represents a linear or branched alkyl group having 1–4 carbon atoms or a monovalent hydrocarbon group with 4–20 carbon atoms having an alicyclic structure or a derivative thereof, or any two $R^6$ groups form in combination with the carbon atom to which each $R^6$ group bonds a divalent hydrocarbon group with 4–20 carbon atoms having an alicyclic structure or a derivative thereof, with the remaining $R^6$ groups being a linear or branched alkyl group having 1–4 carbon atoms or a monovalent hydrocarbon group with 4–20 carbon atoms having an alicyclic structure or a derivative thereof.

DETAILED DESCRIPTION OF THE INVENTION

The present invention will be described in detail below.

Resin (A)

The component (A) of the present invention is a resin comprising a hydroxyl group or carboxyl group, of which the hydrogen atom has been replaced by an acid-dissociable group possessing an alkali dissolution controlling capability (hereinafter referred to as an "acid-dissociable group"), wherein the acid-dissociable group dissociates by the action of an acid generated by irradiation and increases the solubility of the resin in an alkaline aqueous solution (this resin is hereinafter referred to as "resin (A)").

In the resin (A), the hydroxyl group of which the hydrogen atom is replaced by an acid-dissociable group may be either an alcoholic hydroxyl group or a phenolic hydroxyl group.

Any resins including addition polymerization resins, condensation polymerization resins, polyaddition resins, ring-opening polymerization resins, and the like can be used without specific limitations as the resin (A) inasmuch as the resin satisfies the above-described requirements. Of these resins, the addition polymerization resins are particularly preferable.

As the acid-dissociable group in the resin (A), an acid-dissociable group substituting the hydrogen atom of a carboxyl group is preferable. In the following description, the whole group consisting —COO— and an acid-dissociable group made by linkage of the acid-dissociable group and a carbonyl oxy group is referred to as an "acid-dissociable ester group".

As preferable examples of the acid-dissociable ester group in the present invention, a group shown by the following formula (3) (hereinafter referred to as "an acid-dissociable ester group (I)") and a group shown by the following formula (4) (hereinafter referred to as "an acid-dissociable ester group (II)") can be given,

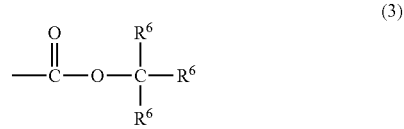

(3)

wherein $R^6$ individually represents a linear or branched alkyl group having 1–4 carbon atoms or a monovalent hydrocarbon group with 4–20 carbon atoms having an alicyclic structure or a derivative thereof, or any two $R^6$ groups form in combination with the carbon atom to which each $R^6$ group bonds a divalent hydrocarbon group with 4–20 carbon atoms having an alicyclic structure or a derivative thereof, with the remaining $R^6$ groups being a linear or branched alkyl group having 1–4 carbon atoms or a monovalent hydrocarbon group with 4–20 carbon atoms having an alicyclic structure or a derivative thereof, and

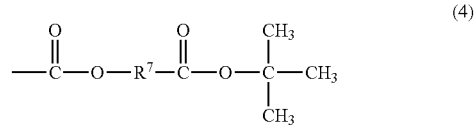

(4)

wherein $R^7$ represents a linear or branched divalent hydrocarbon group having 1–4 main chain carbon atoms or a divalent hydrocarbon group with 3–15 carbon atoms having an alicyclic structure.

In the acid-dissociable ester group (I), the bonding between the carbonyloxy group and the group —C(R$^6$)$_3$ dissociates in the presence of an acid. In the acid-dissociable ester group (II), the bonding between the oxycarbonyl group and t-butyl group of the t-butoxycarbonyl group dissociates in the presence of an acid.

As examples of the linear or branched alkyl group having 1–4 carbon atoms represented by $R^6$ in the formula (3), a methyl group, ethyl group, n-propyl group, i-propyl group, n-butyl group, 2-methylpropyl group, 1-methylpropyl group, and t-butyl group can be given.

Of these alkyl groups, a methyl group and an ethyl group are particularly preferable.

As examples of the monovalent hydrocarbon group with 4–20 carbon atoms having an alicyclic structure represented by $R^6$ (hereinafter referred to as a "monovalent alicyclic hydrocarbon group") and the divalent hydrocarbon group with 4–20 carbon atoms having an alicyclic structure formed by any two $R^6$ groups in combination (hereinafter referred to as a "divalent alicyclic hydrocarbon group"), alicyclic groups derived from a cycloalkane such as norbornane, tricyclodecane, tetracyclododecane, adamantane, cyclobutane, cyclopentane, cyclohexane, cycloheptane, or cyclooctane, and groups obtained by replacing hydrogen atoms on these alicyclic groups with one or more linear or branched alkyl groups having 1–4 carbon atoms, such as methyl group, ethyl group, n-propyl group, i-propyl group, n-butyl group, 2-methylpropyl group, 1-methylpropyl group, or t-butyl group, can be given.

Of these monovalent and divalent alicyclic hydrocarbon groups, groups containing an alicyclic ring derived from norbornane, tricyclodecane, tetracyclododecane, adamantane, cyclopentane, or cyclohexane groups or groups in which these alicyclic ring-containing groups are substituted with the above alkyl groups are preferable.

As examples of derivatives of the monovalent or divalent alicyclic hydrocarbon groups, groups having one or more substituents such as a hydroxyl group; a carboxyl group; a linear or branched hydroxyalkyl group having 1–4 carbon atoms such as a hydroxymethyl group, 1-hydroxyethyl group, 2-hydroxyethyl group, 1-hydroxy-n-propyl group, 2-hydroxy-n-propyl group, 3-hydroxy-n-propyl group, 1-hydroxy-n-butyl group, 2-hydroxy-n-butyl group, 3-hydroxy-n-butyl group, and 4-hydroxy-n-butyl group; a linear or branched alkoxyl group having 1–4 carbon atoms such as a methoxy group, ethoxy group, n-propoxy group, i-propoxy group, n-butoxy group, 2-methylpropoxy group, 1-methylpropoxy group, and t-butoxy group; a cyano group; and a linear or branched cyanoalkyl group having 2–5 carbon atoms such as a cyanomethyl group, 1-cyanoethyl group, 2-cyanoethyl group, 1-cyanopropyl group, 2-cyanopropyl group, 3-cyanopropyl group, 1-cyanobutyl group, 2-cyanobutyl group, 3-cyanobutyl group, and 4-cyanobutyl group can be given.

Of these substituents, a hydroxyl group, carboxyl group, hydroxymethyl group, cyano group, cyanomethyl group, and the like are preferable.

As examples of the linear or branched divalent hydrocarbon group having 1–4 carbon atoms in the main chain represented by $R^7$ in the formula (4), a methylene group, 1,1-dimethylmethylene group, ethylene group, propylene group, 1,1-dimethylethylene group, trimethylene group, and tetramethylene group can be given.

As examples of the divalent hydrocarbon group with 3–15 carbon atoms having an alicyclic structure (hereinafter referred to as "divalent alicyclic hydrocarbon group (ii)") represented by $R^7$, groups containing an alicyclic ring derived from norbornane, tricyclodecane, tetracyclododecane, adamantane, or cycloalkanes such as cyclopropane, cyclobutane, cyclopentane, cyclohexane, cycloheptane, and cyclooctane; and groups in which the above group containing an alicyclic ring is substituted with one or more linear or branched alkyl groups having 1–4 carbon atoms such as a methyl group, ethyl group, n-propyl group, i-propyl group, n-butyl group, 2-methylpropyl group, 1-methylpropyl group, and t-butyl group can be given.

Of these divalent alicyclic hydrocarbon groups (ii), groups containing an alicyclic ring derived from norbornane, tricyclodecane, tetracyclododecane, adamantane, or cyclohexane groups or groups in which these alicyclic ring-containing groups are substituted with the above alkyl groups are preferable.

As specific preferable examples of the acid-dissociable ester group (I), t-butoxycarbonyl group and groups shown by the following formulas (I-1) to (I-49) can be given.

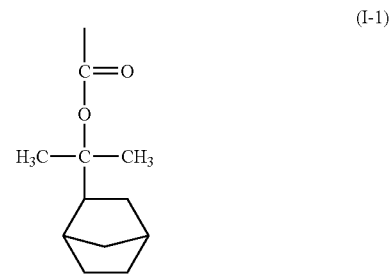

(I-1)

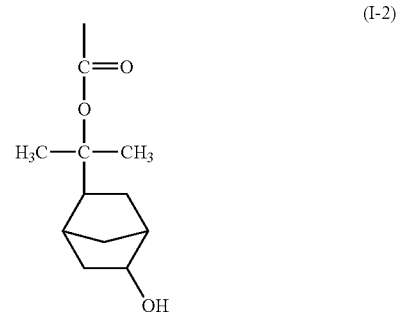

(I-2)

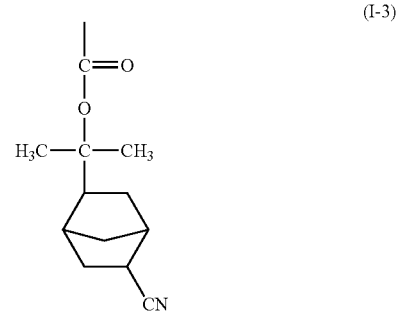

(I-3)

-continued
(I-4)
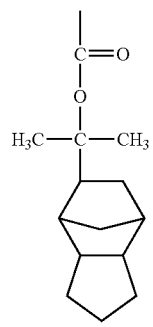
(I-5)
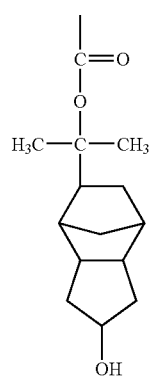
(I-6)
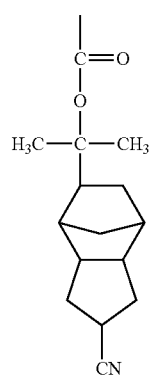
(I-7)
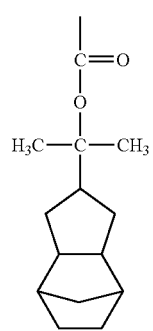
-continued
(I-8)
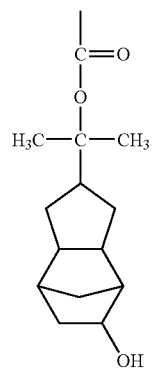
(I-9)
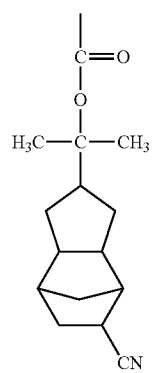
(I-10)
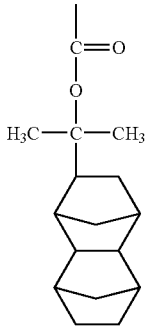
(I-11)
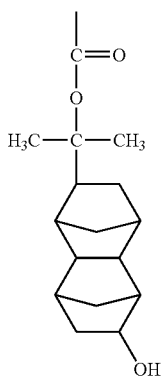

-continued
(I-12)
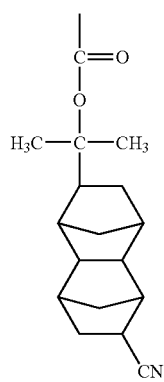
(I-13)
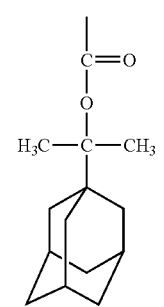
(I-14)
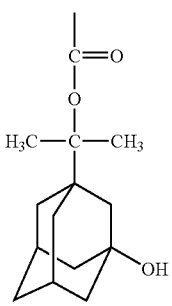
(I-15)
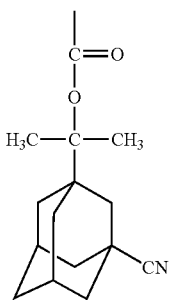
(I-16)
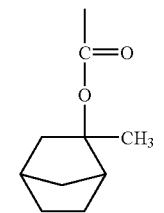
-continued
(I-17)
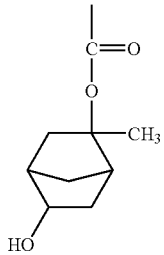
(I-18)
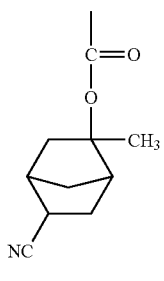
(I-19)
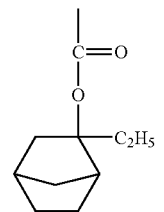
(I-20)
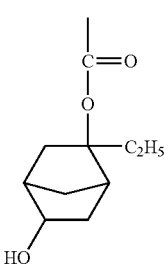
(I-21)
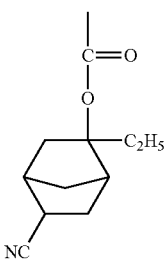
(I-22)
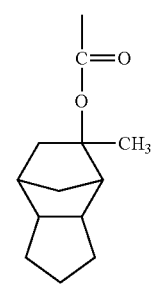

-continued
(I-23)
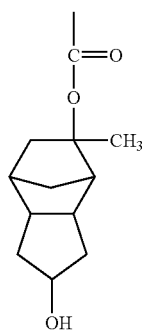
(I-24)
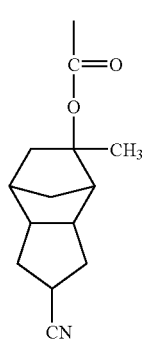
(I-25)
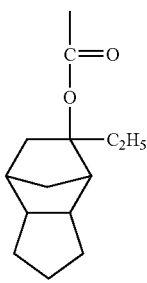
(I-26)
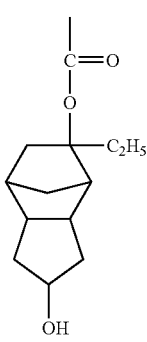
(I-27)
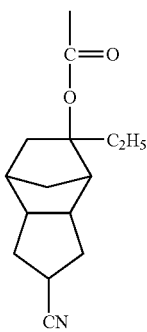
(I-28)
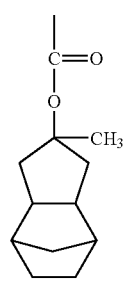
(I-29)
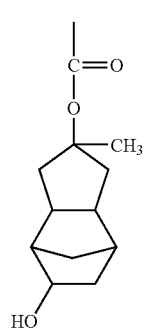
(I-30)
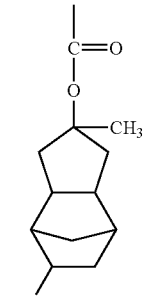
(I-31)
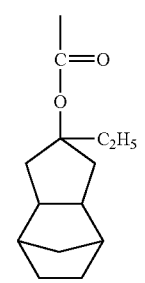
(I-32)
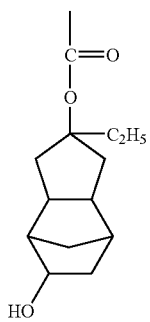

-continued
(I-33)
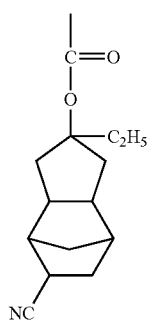
(I-34)
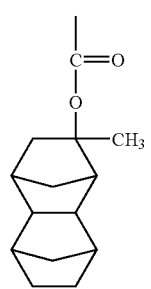
(I-35)
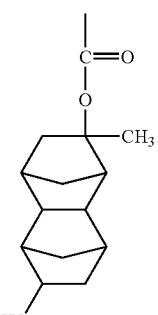
(I-36)
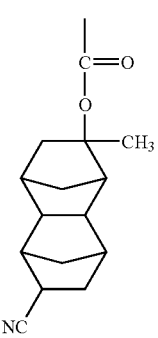
(I-37)
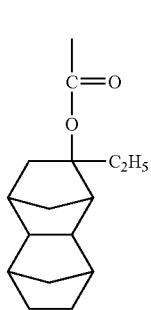
-continued
(I-38)
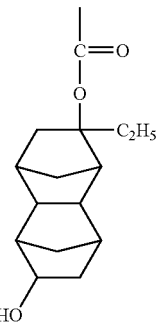
(I-39)
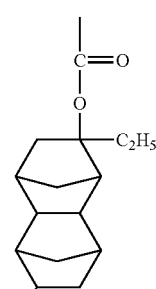
(I-40)
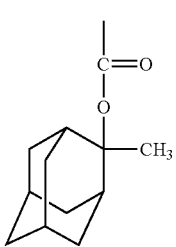
(I-41)
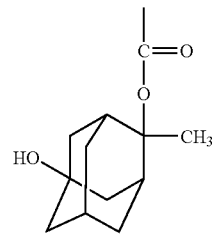
(I-42)
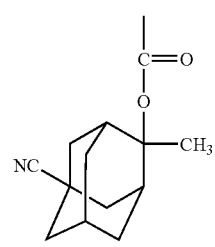
(I-43)
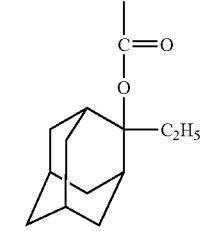

-continued (I-44)
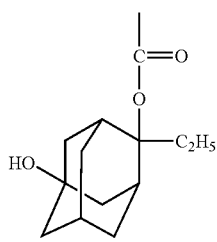

(I-45)
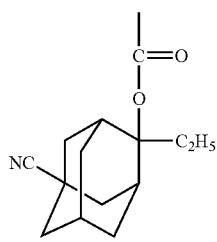

(I-46)
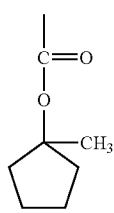

(I-47)
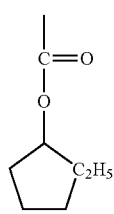

(I-48)
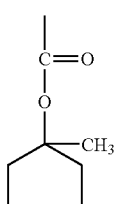

(I-49)
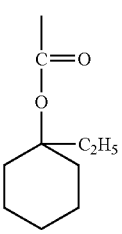

Of these acid-dissociating groups (I), t-butoxycarbonyl group and the groups shown by the formulas (I-1), (I-2), (I-10), (I-11), (I-13), (I-14), (I-16), (I-17), (I-19), (I-20), (I-34), (I-35), (I-37), (I-38), (I-40), (I-41), (I-43), (I-44), (I-46), (I-47), (I-48), and (I-49) are preferable. Of these acid-dissociating groups (I), the groups shown by the formulas (I-1), (I-13), (I-16), (I-19), (I-40), (I-43), (I-44), (I-46), (I-47), (I-48), and (I-49) are particularly preferable.

As preferable examples of the resin (A) having an acid-dissociable ester group selected from the group consisting of the acid-dissociable ester group (I) and the acid-dissociable ester group (II), a resin having one or more recurring units selected from the group consisting of a recurring unit having the following formula (5) (hereinafter referred to as a "(meth) acrylic recurring unit (5)"), (5)
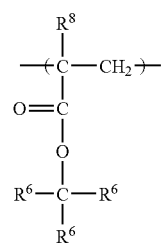

wherein $R^6$ is the same as the $R^6$ in the formula (3) and $R^8$ represents a hydrogen atom or a methyl group,
a recurring unit having the following formula (6) (hereinafter referred to as a "(meth) acrylic recurring unit (6)"), (6)
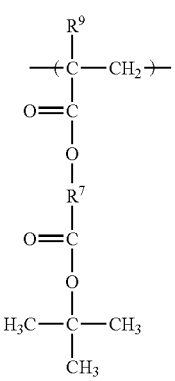

wherein $R^7$ is the same as the $R^7$ in the formula (4) and $R^9$ represents a hydrogen atom or a methyl group, and
a recurring unit having the following formula (7) (hereinafter referred to as a "norbornene recurring unit (7)"), and (7)
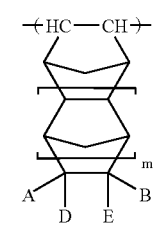

wherein A and B individually represent a hydrogen atom or an acid-dissociable ester group selected from the group consisting of the acid-dissociable ester groups (I) and acid-dissociable ester groups (II), at least one of A and B being the acid-dissociable ester group, D and E individually represent a hydrogen atom or a linear or branched monovalent alkyl group having 1–4 carbon atoms, and m is an integer of 0 to 2, can be given.

Of the acid-dissociable ester groups represented by A or B in the formula (7), t-butoxycarbonyl group, t-butoxycarbonylmethoxycarbonyl group, and the groups shown by the formulas (I-1), (I-2), (I-10), (I-11), (I-13), (I-14), (I-16), (I-17), (I-19), (I-20), (I-34), (I-35), (I-37), (I-38), (I-40), (I-41), (I-43), (I-44), (I-46), (I-47), (I-48), or (I-49) are preferable.

As examples of the linear or branched alkyl group having 1–4 carbon atoms represented by D or E, a methyl group, ethyl group, n-propyl group, i-propyl group, n-butyl group, 2-methylpropyl group, 1-methylpropyl group, and t-butyl group can be given.

Of these alkyl groups, a methyl group and an ethyl group are particularly preferable.

m in the formula (7) is preferably either 0 or 1.

In the resin (A1), either one recurring unit or two or more recurring units from each of the (meth) acrylic recurring unit (5), (meth)acrylic recurring unit (6), and norbornene recurring unit (7) may be used, and two recurring units from among the recurring units (5), (6), and (7) or all of the recurring units (5), (6), and (7) may be used.

The monomer providing the (meth) acrylic recurring unit (5) is a compound derived from (meth)acrylic acid by converting the carboxyl group into the acid-dissociable ester group (I).

The monomer providing the (meth) acrylic recurring unit (6) is a compound derived from (meth)acrylic acid by converting the carboxyl group into the acid-dissociable ester group (II).

As examples of the monomer providing the norbornene recurring unit (7), compounds shown by the following formula (8) (hereinafter referred to as "acid-dissociable group-containing norbornene derivatives") can be given.

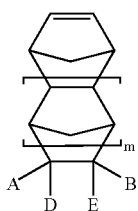

(8)

wherein A, B, D, E, and m have the same meanings as defined for the formula (7).

Examples of the norbornene derivatives containing acid-dissociable group include: compounds wherein the group A is a group selected from the group consisting of the groups shown by the formulas (I-1), (I-2), (I-10), (I-11), (I-13), (I-14), (I-16), (I-17), (I-19), (I-20), (I-34), (I-35), (I-37), (I-38), (I-40), (I-41), (I-43), (I-44), (I-46), (I-47), (I-48), or (I-49), the groups B, D, and E are hydrogen atoms, and m is 0; bicyclo[2.2.1]hept-2-ene derivatives such as, 5-t-butoxycarbonylbicyclo[2.2.1]hept-2-ene, 5-(1-ethoxyethoxycarbonyl)bicyclo[2.2.1]hept-2-ene, 5-(1-cyclohexyloxyethoxycarbonyl)bicyclo[2.2.1]hept-2-ene, 5-t-butoxycarbonylmethoxycarbonylbicyclo[2.2.1]hept-2-ene, 5-tetrahydrofuranyloxycarbonylbicyclo[2.2.1]hept-2-ene, 5-tetrahydropyranyloxycarbonylbicyclo[2.2.1]hept-2-ene, 5-methyl-5-t-butoxycarbonylbicyclo[2.2.1]hept-2-ene, 5-methyl-5-(1-ethoxyethoxycarbonyl)bicyclo[2.2.1]hept-2-ene, 5-methyl-5-(1-cyclohexyloxyethoxycarbonyl)bicyclo[2.2.1]hept-2-ene, 5-methyl-5-t-butoxycarbonylmethoxycarbonylbicyclo[2.2.1]hept-2-ene, 5-methyl-5-tetrahydrofuranyloxycarbonylbicyclo[2.2.1]hept-2-ene, 5-methyl-5-tetrahydropyranyloxycarbonylbicyclo[2.2.1]hept-2-ene, 5,6-di(t-butoxycarbonyl)bicyclo[2.2.1]hept-2-ene, 5,6-di(t-butoxycarbonylmethoxycarbonyl)bicyclo[2.2.1]hept-2-ene, 5,6-di(1-cyclohexyloxyethoxycarbonyl)bicyclo[2.2.1]hept-2-ene, 5,6-di(t-butoxycarbonylmethoxycarbonyl)bicyclo[2.2.1]hept-2-ene, 5,6-di(tetrahydrofuranyloxycarbonyl)bicyclo[2.2.1]hept-2-ene, and 5,6-di(tetrahydropyranyloxycarbonyl)bicyclo[2.2.1]hept-2-ene; compounds wherein the group A is a group selected from the group consisting of the groups shown by the formulas (I-1), (I-2), (I-10), (I-11), (I-13), (I-14), (I-16), (I-17), (I-19), (I-20), (I-34), (I-35), (I-37), (I-38), (I-40), (I-41), (I-43), (I-44), (I-46), (I-47), (I-48), or (I-49), the groups B, D, and E are hydrogen atoms, and m is 1; tetracyclo[4.4.0.1$^{2,5}$.1$^{7,10}$]dodec-3-ene derivatives such as 8-t-butoxycarbonyltetracyclo[4.4.0.1$^{2,5}$.1$^{7,10}$]dodec-3-ene, 8-(1-ethoxyethoxycarbonyl)tetracyclo[4.4.0.1$^{2,5}$.1$^{7,10}$]dodec-3-ene, 8-(1-cyclohexyloxyethoxycarbonyl)tetracyclo[4.4.0.1$^{2,5}$.1$^{7,10}$]dodec-3-ene, 8-t-butoxycarbonylmethoxycarbonyltetracyclo[4.4.0.1$^{2,5}$.1$^{7,10}$]dodec-3-ene, 8-tetrahydrofuranyloxycarbonyltetracyclo[4.4.0.1$^{2,5}$.1$^{7,10}$]dodec-3-ene, 8-tetrahydropyranyloxycarbonyltetracyclo[4.4.0.1$^{2,5}$.1$^{7,10}$]dodec-3-ene, 8-methyl-8-t-butoxycarbonyltetracyclo[4.4.0.1$^{2,5}$.1$^{7,10}$]dodec-3-ene, 8-methyl-8-(1-ethoxyethoxycarbonyl)tetracyclo-[4.4.0.1$^{2,5}$.1$^{7,10}$]dodec-3-ene, 8-methyl-8-(1-cyclohexyloxyethoxycarbonyl)tetracyclo-[4.4.0.1$^{2,5}$.1$^{7,10}$]dodec-3-ene, 8-methyl-8-t-butoxycarbonylmethoxycarbonyltetracyclo-[4.4.0.1$^{2,5}$.1$^{7,10}$]dodec-3-ene, 8-methyl-8-tetrahydrofuranyloxycarbonyltetracyclo-[4.4.0.1$^{2,5}$.1$^{7,10}$]dodec-3-ene, 8-methyl-8-tetrahydropyranyloxycarbonyltetracyclo-[4.4.0.1$^{2,5}$.1$^{7,10}$]dodec-3-ene, 8,9-di(t-butoxycarbonyl)tetracyclo[4.4.0.1$^{2,5}$.1$^{7,10}$]dodec-3-ene, 8,9-di(1-ethoxyethoxycarbonyl)tetracyclo[4.4.0.1$^{2,5}$.1$^{7,10}$]dodec-3-ene, 8,9-di(1-cyclohexyloxyethoxycarbonyl)tetracyclo-[4.4.0.1$^{2,5}$.1$^{7,10}$]dodec-3-ene, 8,9-di(t-butoxycarbonylmethoxycarbonyl)tetracyclo-[4.4.0.1$^{2,5}$.1$^{7,10}$]dodec-3-ene, 8,9-di(tetrahydrofuranyloxycarbonyl)tetracyclo-[4.4.0.1$^{2,5}$.1$^{7,10}$]dodec-3-ene, and 8,9-di(tetrahydropyranyloxycarbonyl)tetracyclo-[4.4.0.1$^{2,5}$.1$^{7,10}$]dodec-3-ene.

Of these acid-dissociable group-containing norbornene derivatives, the following compounds are preferable: compounds wherein the group A is a group selected from the group consisting of the groups shown by the formulas (I-1), (I-2), (I-10), (I-11), (I-13), (I-14), (I-16), (I-17), (I-19), (I-20), (I-34), (I-35), (I-37), (I-38), (I-40), (I-41), (I-43), (I-44), (I-46), (I-47), (I-48), and (I-49), the groups B, D, and E are a hydrogen atom, and m is 0; 5-t-butoxycarbonylbicyclo[2.2.1]hept-2-ene, 5,6-di(t-butoxycarbonyl)bicyclo[2.2.1]hept-2-ene, 5,6-di(t-butoxycarbonylmethoxycarbonyl)bicyclo[2.2.1]hept-2-ene, compounds wherein the group A is a group selected from the group consisting of the groups shown by the formulas (I-1), (I-2), (I-10), (I-11), (I-13), (I-14), (I-16), (I-17), (I-19), (I-20), (I-34), (I-35), (I-37), (I-38), (I-40), (I-41), (I-43), (I-44), (I-46), (I-47), (I-48), and (I-49), the groups B, D, and E are a hydrogen atom, and m is 1; 8-t-butoxycarbonyltetracyclo[4.4.0.1$^{2,5}$.1$^{7,10}$]dodec-3-ene, 8-methyl-8-t-butoxycarbonyltetracyclo[4.4.0.1$^{2,5}$.1$^{7,10}$]dodec-3-ene, and 8-methyl-8-t-butoxycarbonylmethoxycarbonyltetracyclo-[4.4.0.1$^{2,5}$.1$^{7,10}$]dodec-3-ene.

The resin (A1) may comprise one or more recurring units other than the (meth)acrylic recurring units (5), (meth)acrylic recurring units (6), and norbornene recurring units (7) (hereinafter referred to as "other recurring units").

The following compounds can be given as examples of monomers providing such other recurring units: monofunctional monomers, which include (meth)acrylates having a bridged hydrocarbon skeleton such as norbornyl (meth)acrylate, isobornyl (meth)acrylate, tricyclodecanyl (meth)acrylate, carboxytricyclodecanyl (meth)acrylate, tetracyclodecanyl (meth)acrylate, carboxytetracyclodecanyl (meth)acrylate, dicyclopentenyl (meth)acrylate, adamantly (meth)acrylate, 3,5-dihydroxy-1-adamantyl (meth)acrylate, 3-hydroxy-5,7-dimethyl-1-adamantyl (meth)acrylate, 4-oxo-1-adamantyl (meth)acrylate, 3-hydroxy-1-adamantyl (meth)acrylate, and adamantylmethyl (meth)acrylate; (meth)acrylates having a lactone structure such as compounds shown by the following formulas (9)–(13),

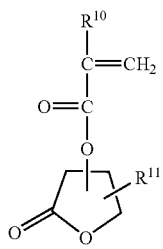
(9)

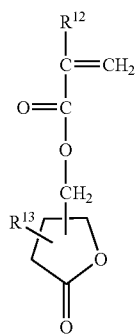
(10)

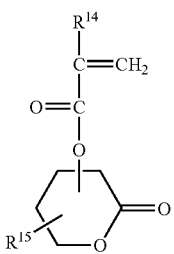
(11)

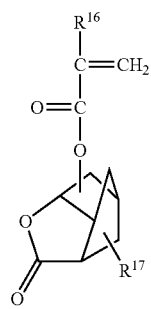
(12)

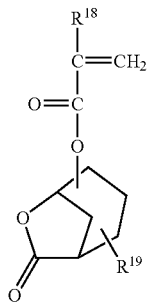
(13)

wherein $R^{10}$, $R^{11}$, $R^{12}$, $R^{13}$, $R^{14}$, $R^{15}$, $R^{16}$, $R^{17}$, $R^{18}$, and $R^{19}$ individually represent a hydrogen atom or a linear or branched alkyl group having 1–4 carbon atoms; α-hydroxymethylacrylates such as methyl α-hydroxymethylacrylate, ethyl α-hydroxymethylacrylate, n-propyl α-hydroxymethylacrylate, and n-butyl α-hydroxymethylacrylate; carboxyl group-containing esters of unsaturated carboxylic acid having no bridged hydrocarbon skeleton such as 2-carboxyethyl (meth)acrylate, 2-carboxypropyl (meth)acrylate, 3-carboxypropyl (meth)acrylate, 4-carboxybutyl (meth)acrylate, and 4-carboxycyclohexyl (meth)acrylate; other (meth)acrylatic acid esters such as methyl (meth)acrylate, ethyl (meth)acrylate, n-propyl (meth)acrylate, n-butyl (meth)acrylate, 2-methylpropyl (meth)acrylate, 1-methylpropyl (meth)acrylate, 2-hydroxyethyl (meth)acrylate, 2-hydroxypropyl (meth)acrylate, 3-hydroxypropyl (meth)acrylate, cyclopropyl (meth)acrylate, cyclopentyl (meth)acrylate, cyclohexyl (meth)acrylate, cyclohexenyl (meth)acrylate, 4-methoxycyclohexyl (meth)acrylate, 2-cyclopropyloxycarbonylethyl (meth)acrylate, 2-cyclopentyloxycarbonylethyl (meth)acrylate, 2-cyclohexyloxycarbonylethyl (meth)acrylate, 2-cyclohexenyloxycarbonylethyl (meth)acrylate, and 2-(4-methoxycyclohexyl)oxycarbonylethyl (meth)acrylate; norbornene or its derivatives such as norbornene (e.g. bicyclo[2.2.1]hept-2-ene), 5-methylbicyclo[2.2.1]hept-2-ene, 5-ethylbicyclo[2.2.1]hept-2-ene, 5-n-propylbicyclo[2.2.1]hept-2-ene, 5-n-butylbicyclo[2.2.1]hept-2-ene, 5-n-pentylbicyclo[2.2.1]hept-2-ene, 5-n-hexylbicyclo[2.2.1]hept-2-ene, 5-hydroxybicyclo[2.2.1]hept-2-ene, 5-hydroxymethylbicyclo[2.2.1]hept-2-ene, 5-fluorobicyclo[2.2.1]hept-2-ene, 5-fluoromethylbicyclo[2.2.1]hept-2-ene, 5-difluoromethylbicyclo[2.2.1]hept-2-ene, 5-trifluoromethylbicyclo[2.2.1]hept-2-ene, 5-pentafluoroethylbicyclo[2.2.1]hept-2-ene, 5-(2-hydroxy-2-trifluoromethylethyl)bicyclo[2.2.1]hept-2-ene, 5-{2-hydroxy-2,2-bis(trifluoromethyl)ethyl}bicyclo[2.2.1]hept-2-ene, 5,5-difluorobicyclo[2.2.1]hept-2-ene, 5,6-difluorobicyclo[2.2.1]hept-2-ene, 5,5-bis(trifluoromethyl)bicyclo[2.2.1]hept-2-ene, 5,6-bis(trifluoromethyl)bicyclo[2.2.1]hept-2-ene, 5-methyl-5-trifluoromethylbicyclo[2.2.1]hept-2-2ene, 5,5,6-trifluorobicyclo[2.2.1]hept-2-ene, 5,5,6-tris(trifluoromethyl)bicyclo[2.2.1]hept-2-ene, 5,5,6,6-tetrafluorobicyclo[2.2.1]hept-2-ene, 5,5,6,6-tetrakis(trifluoromethyl)bicyclo[2.2.1]hept-2-ene, 5,5-difluoro-6,6-bis(trifluoromethyl)bicyclo[2.2.1]hept-2-ene, 5,6-difluoro-5,6-bis(trifluoromethyl)bicyclo[2.2.1]hept-2-ene, 5,5,6-trifluoro-6-trifluoromethylbicyclo[2.2.1]hept-2-ene, 5,6,7-trifluoro-6-trifluoromethoxylbicyclo[2.2.1]hept-2-ene, 5,5,6-trifluoro-9-pentafluoropropoxybicyclo[2.2.1]hept-2-ene, 5-fluoro-5- pentafluoroethyl-6,6-bis(trifluoromethyl)-bicyclo[2.2.1]hept-2-ene, 5,6-difluoro-5-heptafluoroisopropyl-6-trifluoromethyl-bicyclo[2.2.1]hept-2-ene, 5-chloro-5,6,6-trifluorobicyclo[2.2.1]hept-2-ene, 5,6-dichloro-5,6-bis(trifluoromethyl)bicyclo[2.2.1]hept-2-ene, 5-(2,2,2-trifluorocarboethoxy)bicyclo[2.2.1]hept-2-ene, 5-methyl-5-(2,2,2-trifluorocarboethoxy)bicyclo[2.2.1]hept-2-ene, tetracyclo[4.4.0.1$^{2,5}$.1$^{7,10}$]dodec-3-ene, 8-methyltetracyclo[4.4.0.1$^{2,5}$.1$^{7,10}$]dodec-3-ene, 8-ethyltetracyclo[4.4.0.1$^{2,5}$.1$^{7,10}$]dodec-3-ene, 8-n-propyltetracyclo[4.4.0.1$^{2,5}$.1$^{7,10}$]dodec-3-ene, 8-n-butyltetracyclo[4.4.0.1$^{2,5}$.1$^{7,10}$]dodec-3-ene, 8-n-pentyltetracyclo[4.4.0.1$^{2,5}$.1$^{7,10}$]dodec-3-ene, 8-n-hexyltetracyclo[4.4.0.1$^{2,5}$.1$^{7,10}$]dodec-3-ene, 8-hydroxytetracyclo[4.4.0.1$^{2,5}$.1$^{7,10}$]dodec-3-ene, 8-hydroxymethyltetracyclo[4.4.0.1$^{2,5}$.1$^{7,10}$]dodec-3-ene, 8-fluorotetracyclo[4.4.0.1$^{2,5}$.1$^{7,10}$]dodec-3-ene, 8-fluoromethyltetracyclo[4.4.0.1$^{2,5}$.1$^{7,10}$]dodec-3-ene, 8-difluoromethyltetracyclo[4.4.0.1$^{2,5}$.1$^{7,10}$]dodec-3-ene, 8-trifluoromethyltetracyclo[4.4.0.1$^{2,5}$.1$^{7,10}$]dodec-3-ene, 8-pentafluoroethyltetracyclo[4.4.0.1$^{2,5}$.1$^{7,10}$]dodec-3-ene, 8-(2-hydroxy-2-trifluoromethylethyl)tetracyclo-[4.4.0.1$^{2,5}$.1$^{7,10}$]dodec-3-ene, 8-{2-hydroxy-2,2-bis(trifluoromethyl)ethyl}tetracyclo-[4.4.0.1$^{2,5}$.1$^{7,10}$]dodec-3-ene, 8,8-difluorotetracyclo[4.4.0.1$^{2,5}$.1$^{7,10}$]dodec-3-ene, 8,9-difluorotetracyclo[4.4.0.1$^{2,5}$.1$^{7,10}$]dodec-3-ene, 8,8-bis(trifluoromethyl)tetracyclo[4.4.0.1$^{2,5}$.1$^{7,10}$]dodec-3-ene, 8,9-bis(trifluoromethyl)tetracyclo[4.4.0.1$^{2,5}$.1$^{7,10}$]dodec-3-ene, 8-methyl-8-trifluoromethyltetracyclo[4.4.0.1$^{2,5}$.1$^{7,10}$]dodec-3-ene, 8,8,9-trifluorotetracyclo[4.4.0.1$^{2,5}$.1$^{7,10}$]dodec-3-ene, 8,8,9-tris(trifluoromethyl)tetracyclo[4.4.0.1$^{2,5}$.1$^{7,10}$]dodec-3-ene, 8,8,9,9-tetrafluorotetracyclo[4.4.0.1$^{2,5}$.1$^{7,10}$]dodec-3-ene, 8,8,9,9-tetrakis(trifluoromethyl)tetracyclo[4.4.0.1$^{2,5}$.1$^{7,10}$]dodec-3-ene, 8,8-difluoro-9,9-bis(trifluoromethyl)tetracyclo-[4.4.0.1$^{2,5}$.1$^{7,10}$]dodec-3-ene, 8,9-difluoro-8,9-bis(trifluoromethyl)tetracyclo-[4.4.0.1$^{2,5}$.1$^{7,10}$]dodec-3-ene, 8,8,9-trifluoro-9-trifluoromethyltetracyclo-[4.4.0.1$^{2,5}$.1$^{7,10}$]dodec-3-ene, 8,8,9-trifluoro-9-trifluoromethoxytetracyclo-[4.4.0.1$^{2,5}$.1$^{7,10}$]dodec-3-ene, 8,8,9-trifluoro-9-pentafluoropropoxytetracyclo-[4.4.0.1$^{2,5}$.1$^{7,10}$]dodec-3-ene, 8-fluoro-8-pentafluoroethyl-9,9-bis(trifluoromethyl)-tetracyclo[4.4.0.1$^{2,5}$.1$^{7,10}$]dodec-3-ene, 8,9-difluoro-8-heptafluoroisopropyl-9-trifluoromethyl-tetracyclo[4.4.0.1$^{2,5}$.1$^{7,10}$]dodec-3-ene, 8-chloro-8,9,9-trifluorotetracyclo[4.4.0.1$^{2,5}$.1$^{7,10}$]dodec-3-ene, 8,9-dichloro-8,9-bis(trifluoromethyl)tetracyclo-[4.4.0.1$^{2,5}$.1$^{7,10}$]dodec-3-ene, 8-(2,2,2-trifluorocarboethoxy)tetracyclo[4.4.0.1$^{2,5}$.1$^{7,10}$]dodec-3-ene, and 8-methyl-8-(2,2,2-trifluorocarboethoxy)tetracyclo-[4.4.0.1$^{2,5}$.1$^{7,10}$]dodec-3-ene; other addition-polymerizable alicyclic compounds such as dicyclopentadiene, tricyclo[5.2.1.0$^{2,6}$]dec-8-ene, tricyclo[5.2.1.0$^{2,6}$]dec-3-ene, tricyclo[4.4.0.1$^{2,5}$]undec-3-ene, tricyclo[6.2.1.0$^{1,8}$]undec-9-ene, tricyclo[6.2.1.0$^{1,8}$]undec-4-ene, tetracyclo[4.4.0.1$^{2,5}$.1$^{7,10}$.0$^{1,6}$]dodec-3-ene, 8-methyltetracyclo[4.4.0.1$^{2,5}$.1$^{7,12}$.0$^{1,6}$]dodec-3-ene, 8-ethylidenetetracyclo[4.4.0.1$^{2,5}$.1$^{7,12}$]dodec-3-ene, 8-ethylidenetetracyclo[4.4.0.1$^{2,5}$.1$^{7,10}$.0$^{1,6}$]dodec-3-ene, pentacyclo[6.5.1.1$^{3,6}$.0$^{2,7}$.0$^{9,13}$]pentadec-4-ene, and pentacyclo[7.4.0.1$^{2,5}$.1$^{9,12}$.0$^{8,13}$]pentadec-3-ene; vinyl esters such as vinyl acetate, vinyl propionate, and vinyl butyrate; unsaturated nitrile compounds such as (meth)acrylonitrile, α-chloroacrylonitrile, crotonitrile, maleinitrile, fumaronitrile, mesaconitrile, citraconitrile, and itaconitrile; unsaturated amide compounds such as (meth)acrylamide, N,N-dimethyl (meth)acrylamide, crotonamide, maleinamide, fumaramide, mesaconamide, citraconamide, and itaconamide; other nitrogen-containing vinyl compounds such as N-vinyl-ε-caprolactam, N-vinylpyrrolidone, vinylpyridine, and vinylimidazole; unsaturated carboxylic acids (anhydrides) such as (meth)acrylic acid, crotonic acid, maleic acid, maleic anhydride, fumaric acid, itaconic acid, itaconic anhydride, citraconic acid, citraconic anhydride, and mesaconic acid; polyfunctional monomers including polyfunctional monomers having a bridged hydrocarbon skeleton such as 1,2-adamantanediol di(meth)acrylate, 1,3-adamantanediol di(meth)acrylate, 1,4-adamantanediol di(meth)acrylate, and tricyclodecanyldimethylol di(meth)acrylate; and polyfunctional monomers having no bridged hydrocarbon skeleton such as methylene glycol di(meth)acrylate, ethylene glycol di(meth)acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)benzene di(meth)acrylate, and 1,3-bis(2-hydroxypropyl)benzene di(meth)acrylate.

Of these monomers providing the other recurring units, (meth)acrylates having a bridged hydrocarbon skeleton, (meth)acrylates having a lactone structure, and the like are preferable.

As the resin (A1) in the present invention, a recurring unit originating from a (meth)acrylate having an acid-dissociable group and a recurring unit originating from a (meth)acrylate having a lactone structure are preferable. A more preferable resin (A1) is a copolymer containing at least one recurring unit selected from (meth)acrylic recurring unit (5) and (meth)acrylic recurring unit (6), at least one recurring unit originating from a (meth)acrylate having a lactone structure, and, optionally, at least one other recurring unit. A particularly preferable resin (A1) is a copolymer containing at least one recurring unit selected from (meth)acrylic recurring unit (5) and (meth)acrylic recurring unit (6), at least one recurring unit originating from a (meth)acrylate having a lactone structure, and at least one recurring unit originating from a (meth)acrylate having a bridged hydrocarbon skeleton.

The total content of the (meth)acrylic recurring unit (5), (meth)acrylic recurring unit (6), and norbornene recurring unit (7) in the resin (A1) is usually 5–70 mol %, preferably 10–65 mol %, and still more preferably 15–60 mol % of the total amount of the recurring units. If the total amount of the above recurring units is less than 5 mol %, resolution capability as a resist tends to decrease. If the amount exceeds 70 mol %, on the other hand, developability decreases and scum (undeveloped areas after development) tends to be easily produced.

When the resin (A1) is a copolymer containing at least one recurring unit selected from (meth)acrylic recurring unit (5) and (meth)acrylic recurring unit (6), at least one recurring unit originating from a (meth)acrylate having a lactone structure, and, optionally, at least one other recurring unit, the total amount of the (meth)acrylic recurring unit (5) and (meth)acrylic recurring unit (6) is usually from 5–70 mol %, preferably from 10–65 mol %, and still more preferably from 15–60 mol %, the amount of the recurring unit originating from a (meth)acrylate having a lactone structure is usually from 5–75 mol %, preferably from 8–70 mol %, and still more preferably from 10–65 mol %, and the amount of the other recurring units is usually 50 mol % or less, and preferably 40 mol % or less.

When the resin (A1) is a copolymer containing at least one recurring unit selected from (meth)acrylic recurring unit (5) and (meth)acrylic recurring unit (6), at least one recurring unit originating from a (meth)acrylate having a lactone structure, and at least one recurring unit originating from a (meth)acrylate having a bridged hydrocarbon skeleton, the total amount of the (meth)acrylic recurring unit (5) and (meth)acrylic recurring unit (6) is usually from 5–70 mol %, preferably from 10–65 mol %, and still more preferably from 15–60 mol %, the amount of the recurring unit originating from a (meth)acrylate having a lactone structure is usually from 5–75 mol %, preferably from 8–70 mol %, and still more preferably from 10–65 mol %, the amount of the recurring unit originating from a (meth)acrylate having a bridged hydrocarbon skeleton is usually from 1–50 mol %, preferably from 3–45 mol %, and still more preferably from 5–40 mol %, and the amount of other recurring units is usually 50 mol % or less, and preferably 40 mol % or less.

The resin (A1) is prepared by (co)polymerizing monomers (a mixture) providing each of the above recurring units in an appropriate solvent in the presence of a chain transfer agent, as required, using a radical polymerization initiator such as a hydroperoxide, dialkyl peroxide, diacyl peroxide, or azo compound.

As examples of the solvent used for polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ketones such as 2-butanone, 4-methyl-2-pentanone, and 2-heptanone; and tetrahydrofuran; ethers such as dimethoxyethanes, and diethoxyethanes can be given.

The solvent may be used either individually or in combination of two or more.

The polymerization temperature is usually 40–120° C., and preferably 50–90° C. The reaction time is usually 1–48 hours, and preferably 1–24 hours.

The polystyrene-reduced weight average molecular weight (hereinafter referred to as "Mw") of the resin (A) determined by gel permeation chromatography (GPC) is usually 3,000–300,000, preferably 4,000–200,000, and still more preferably 5,000–100,000. If Mw of the resin (A) is less than 3,000, heat resistance as a resist tends to decrease. If Mw exceeds 300,000, developability as a resist tends to decrease.

The ratio of Mw to the polystyrene-reduced number average molecular weight (hereinafter referred to as "Mn") determined by gel permeation chromatography (GPC) (Mw/Mn) of the resin (A) is usually 1–5, and preferably 1–3.

It is preferable that the resin (A) contains almost no impurities such as halogens or metals. The smaller the amount of such impurities, the better are the sensitivity, resolution, process stability, pattern shape, or the like as a resist. The resin (A) may be purified by using a chemical purification process such as washing with water or liquid-liquid extraction or a combination of the chemical purification process and a physical purification process such as ultrafiltration or centrifugation, for example.

In the present invention, the resin (A) may be used either individually or in combination of two or more.

Acid Generator (B)

The component (B) of the present invention is a photoacid generator (hereinafter referred to as "acid generator (B)") which comprises a compound (B-1) shown by the following formula (1) (hereinafter referred to as "acid generator (B-1)") and a compound (B-2) shown by the following formula (2) (hereinafter referred to as "acid generator (B-2)"), generating an acid by irradiation (hereinafter referred to as "exposure").

The acid generator (B) causes an acid-dissociable group in the resin (A) to dissociate by the action of an acid generated upon exposure. As a result, an exposed part of the resist film has increased solubility in an alkaline aqueous solution, which enables the resin to form a positive-tone resist pattern.

As examples of the linear or branched alkyl group having 1–4 carbon atoms represented by $R^1$, $R^2$, or $R^3$ in the formula (1) a methyl group, ethyl group, n-propyl group, i-propyl group, n-butyl group, 2-methylpropyl group, 1-methylpropyl group, and t-butyl group can be given.

Of these, a methyl group, ethyl group, n-propyl group, n-butyl group, and t-butyl group are preferable.

Particularly preferable groups for $R^1$ in the formula (1) are hydrogen atoms, methyl group, ethyl group, and n-butyl group.

As the 3–6 member cyclic structure formed by the linkage of $R^2$ and $R^3$, a 5 or 6 member cyclic structure is preferable, and particularly preferable structure is a 5 member cyclic structure (i.e. tetrahydrothiophene cyclic structure).

As $R^2$ and $R^3$ in the formula (1), groups capable of forming a tetrahydrothiophene cyclic structure by the linkage of $R^2$ and $R^3$ are preferable.

As a substituted or unsubstituted, linear or branched fluoroalkylsulfonic acid anion having 1–15 carbon atoms represented by $X^-$ in the formula (1), a super-strong acid sulfonic acid anion is preferable. Specific examples are $CF_3SO_3^-$, $C_4F_9SO_3^-$, and $C_8F_{17}SO_3^-$, with particularly preferable anions being $C_4F_9SO_3^-$ and $C_8F_{17}SO_3^-$. Here, "substituted" indicates that when two or more fluorine atoms are present, one of the fluorine atoms is replaced by a cyclic hydrocarbon group, and preferably alicyclic hydrocarbon group.

As the linear or the branched fluoroalkyl group having 1–15 carbon atoms represented by $R^4$ in the disulfonylimide acid anion represented by the above formula (i) representing the group $X^-$ (hereinafter referred to as "disulfonylimide acid anion (i)"), perfluoroalkyl groups are preferable, and particularly preferable groups are nonafluoro-n-butyl group, perfluoro-n-octyl group, and the like.

Specific examples of the acid generator (B-1) include: 4-hydroxyphenyldimethylsulfonium trifluoromethanesulfonate, 4-hydroxyphenyldimethylsulfonium nonafluoro-n-butanesulfonate, 4-hydroxyphenyldimethylsulfonium perfluoro-n-octanesulfonate, 4-hydroxyphenyldiethylsulfonium trifluoromethanesulfonate, 4-hydroxyphenyldiethylsulfonium nonafluoro-n-butanesulfonate, 4-hydroxyphenyldiethylsulfonium perfluoro-n-octanesulfonate, 4-methoxyphenyldimethylsulfonium trifluoromethanesulfonate, 4-methoxyphenyldimethylsulfonium nonafluoro-n-butanesulfonate, 4-methoxyphenyldimethylsulfonium perfluoro-n-octanesulfonate, 4-methoxyphenyldiethylsulfonium trifluoromethanesulfonate, 4-methoxyphenyldiethylsulfonium nonafluoro-n-butanesulfonate, 4-methoxyphenyldiethylsulfonium perfluoro-n-octanesulfonate, 4-ethoxyphenyldimethylsulfonium trifluoromethanesulfonate, 4-ethoxyphenyldimethylsulfonium nonafluoro-n-butanesulfonate, 4-ethoxyphenyldimethylsulfonium perfluoro-n-octanesulfonate, 4-ethoxyphenyldiethylsulfonium trifluoromethanesulfonate, 4-ethoxyphenyldiethylsulfonium nonafluoro-n-butanesulfonate, 4-ethoxyphenyldiethylsulfonium perfluoro-n-octanesulfonate, 4-n-butoxyphenyldimethylsulfonium trifluoromethanesulfonate, 4-n-butoxyphenyldimethylsulfonium nonafluoro-n-butanesulfonate, 4-n-butoxyphenyldimethylsulfonium perfluoro-n-octanesulfonate, 4-n-butoxyphenyldiethylsulfonium trifluoromethanesulfonate, 4-n-butoxyphenyldiethylsulfonium nonafluoro-n- butanesulfonate, 4-n-butoxyphenyldiethylsulfonium perfluoro-n-octanesulfonate, 3,5-dimethyl-4-hydroxyphenyldimethylsulfonium trifluoromethanesulfonate, 3,5-dimethyl-4-hydroxyphenyldimethylsulfonium nonafluoro-n-butanesulfonate, 3,5-dimethyl-4-hydroxyphenyldimethylsulfonium perfluoro-n-octanesulfonate, 3,5-dimethyl-4-hydroxyphenyldiethylsulfonium trifluoromethanesulfonate, 3,5-dimethyl-4-hydroxyphenyldiethylsulfonium nonafluoro-n-butanesulfonate, 3,5-dimethyl-4-hydroxyphenyldiethylsulfonium perfluoro-n-octanesulfonate, 4-hydroxy-1-naphthyldimethylsulfonium trifluoromethanesulfonate, 4-hydroxy-1-naphthyldimethylsulfonium nonafluoro-n-butanesulfonate, 4-hydroxy-1-naphthyldimethylsulfonium perfluoro-n-octanesulfonate, 4-hydroxy-1-naphthyldiethylsulfonium trifluoromethanesulfonate, 4-hydroxy-1-naphthyldiethylsulfonium nonafluoro-n-butanesulfonate, 4-hydroxy-1-naphthyldiethylsulfonium perfluoro-n-octanesulfonate, 1-(4-hydroxyphenyl)tetrahydrothiophenium trifluoromethanesulfonate, 1-(4-hydroxyphenyl)tetrahydrothiophenium nonafluoro-n-butanesulfonate, 1-(4-hydroxyphenyl)tetrahydrothiophenium perfluoro-n-octanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium bis(pentafluoroethanesulfonyl)imidate, 1-(3,5-dimethyl-4-hydroxyphenyl)tetrahydrothiophenium bis(nonafluoro-n-butanesulfyl)imidare, 1-(4-methoxynaphthalen-1-yl)tetrahydrothiophenium trifluoromethanesulfonate, 1-(4-methoxynaphthalen-1-yl)tetrahydrothiophenium nonafluoro-n-butanesulfonate, 1-(4-methoxynaphthalen-1-yl)tetrahydrothiophenium perfluoro-n-octanesulfonate, 1-(4-ethoxynaphthalen-1-yl)tetrahydrothiophenium trifluoromethanesulfonate, 1-(4-ethoxynaphthalen-1-yl)tetrahydrothiophenium nonafluoro-n-butanesulfonate, 1-(4-ethoxynaphthalen-1-yl)tetrahydrothiophenium perfluoro-n-octanesulfonate, 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium bis(pentafluoroethanesulfonyl)imidate, and 1-(4-n-butoxynaphthalen-1-yl)tetrahydrothiophenium bis(nonafluoro-n-butanesulfonyl)imidate.

Of these acid generators (B-1), 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, and 1-(4-n-butoxynaphthalen-1-yl)tetrahydrothiophenium bis(nonafluoro-n-butanesulfonyl)imidate are preferable.

In the present invention, the acid generator (B-1) may be used either individually or in combination of two or more.

The following groups are given as examples of derivatives of the hydroxyl group represented by $R^5$ in the formula (2):

linear, branched, or cyclic alkoxyl groups having 1–8 carbon atoms such as a methoxy group, ethoxy group, n-propoxy group, i-propoxy group, n-butoxy group, 2-methylpropoxy group, 1-methylpropoxy group, t-butoxygroup, cyclopentyloxy group, and cyclohexyloxy group; linear, branched, or cyclic alkoxyalkoxy groups having 2–8 carbon atoms such as a methoxymethoxy group, ethoxymethoxy group, n-propoxymethoxy group, i-propoxymethoxy group, cyclopentyloxymethoxy group, cyclohexyloxymethoxy group, 2-methoxyethoxy group, 2-ethoxyethoxy group, 2-n-propoxyethoxy group, 2-i-propoxyethoxy group, 2-cyclopentyloxyethoxy group, and 2-cyclohexyloxyethoxy group; and linear, branched, or cyclic hydroxyalkoxyl groups having 1–8 carbon atoms such as a hydroxymethoxy group, 2-hydroxyethoxy group, 3-hydroxy-n-propoxy group, 4-hydroxy-n-butoxy group, 3-hydroxycyclopentyloxy group, and 4-hydroxycyclohexyloxy group.

Of these derivatives, a methoxy group, ethoxy group, and the like are preferable.

As examples of the linear or branched alkyl group having 1–4 carbon atoms represented by $R^5$, a methyl group, ethyl group, n-propyl group, i-propyl group, n-butyl group, 2-methylpropyl group, 1-methylpropyl group, and t-butyl group can be given.

Of these alkyl groups, a methyl group, ethyl group, and the like are preferable.

Particularly preferable groups for $R^5$ in the formula (2) are hydrogen atoms, methyl group, and the like.

As the substituted or unsubstituted, linear or branched fluoroalkylsulfonic acid anion having 2–15 carbon atoms represented by $Y^-$, a super-strong acid sulfonic acid anion is preferable. Specific examples are $C_4F_9SO_3^-$, $C_8F_{17}SO_3^-$, and the like with particularly preferable being $C_4F_9SO_3^-$ and $C_8F_{17}SO_3^-$. The term "substituted" has the same meaning as that previously defined for the group $X^-$.

Specific examples of the acid generator (B-2) include:
triphenylsulfonium nonafluoro-n-butanesulfonate,
triphenylsulfonium perfluoro-n-octanesulfonate,
4-hydroxyphenyldiphenylsulfonium nonafluoro-n-butanesulfonate,
4-hydroxyphenyldiphenylsulfonium perfluoro-n-octanesulfonate,
tri(4-hydroxyphenyl)sulfonium nonafluoro-n-butanesulfonate,
tri(4-hydroxyphenyl) sulfonium perfluoro-n-octanesulfonate,
4-methoxyphenyldiphenylsulfonium nonafluoro-n-butanesulfonate,
4-methoxyphenyldiphenylsulfonium perfluoro-n-octanesulfonate,
tri(4-methoxyphenyl)sulfonium nonafluoro-n-butanesulfonate,
tri(4-methoxyphenyl) sulfonium perfluoro-n-octanesulfonate,
4-ethoxyphenyldiphenylsulfonium nonafluoro-n-butanesulfonate,
4-ethoxyphenyldiphenylsulfonium perfluoro-n-octanesulfonate,
tri(4-ethoxyphenyl)sulfonium nonafluoro-n-butanesulfonate,
tri(4-ethoxyphenyl) sulfonium perfluoro-n-octanesulfonate,
4-methylphenyldimethylsulfonium nonafluoro-n-butanesulfonate, 4-methylphenyldiethylsulfonium perfluoro-n-octanesulfonate, tri(4-methylphenyl)sulfonium nonafluoro-n-butanesulfonate, and tri(4-methylphenyl) sulfonium perfluoro-n-octanesulfonate.

Of these acid generator (B-2), triphenylsulfonium nonafluoro-n-butanesulfonate, triphenylsulfonium perfluoro-n-octanesulfonate, and the like are preferable.

In the present invention, the acid generator (B-2) may be used either individually or in combination of two or more.

In addition, other photoacid generators (hereinafter referred to as "other acid generators") can be used in combination with the acid generator (B-1) and the acid generator (B-2).

As examples of the other acid generators, onium salts, halogen-containing compounds, diazoketone compounds, sulfone compounds, and sulfonate compounds can be given.

Specific examples of the other acid generator are as follows.

Onium Salt:

As examples of the onium salt, iodonium salt, sulfonium salt, phosphonium salt, diazonium salt, and pyridinium salt can be given.

Specific examples of the onium salt include:
diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, cyclohexyl.2-oxocyclohexyl-methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, 1-naphthyldimethylsulfonium trifluoromethanesulfonate, 1-naphthyldimethylsulfonium nonafluoro-n-butanesulfonate, 1-naphthyldimethylsulfonium perfluoro-n-octanesulfonate, 1-naphthyldiethylsulfonium trifluoromethanesulfonate, 1-naphthyldiethylsulfonium nonafluoro-n-butanesulfonate, 1-naphthyldiethylsulfonium perfluoro-n-octanesulfonate, 4-methyl-1-naphthyldimethylsulfonium trifluoromethanesulfonate, 4-methyl-1-naphthyldimethylsulfonium nonafluoro-n-butanesulfonate, 4-methyl-1-naphthyldimethylsulfonium perfluoro-n-octanesulfonate, 4-methyl-1-naphthyldiethylsulfonium trifluoromethanesulfonate, 4-methyl-1-naphthyldiethylsulfonium nonafluoro-n-butanesulfonate, 4-methyl-1-naphthyldiethylsulfonium perfluoro-n-octanesulfonate, 4-cyano-1-naphthyldimethylsulfonium trifluoromethanesulfonate, 4-cyano-1-naphthyldimethylsulfonium nonafluoro-n-butanesulfonate, 4-cyano-1-naphthyldimethylsulfonium perfluoro-n-octanesulfonate, 4-cyano-1-naphthyldiethylsulfonium trifluoromethanesulfonate, 4-cyano-1-naphthyldiethylsulfonium nonafluoro-n-butanesulfonate, 4-cyano-1-naphthyldiethylsulfonium perfluoro-n-octanesulfonate, 4-nitro-1-naphthyldimethylsulfonium trifluoromethanesulfonate, 4-nitro-1-naphthyldimethylsulfonium nonafluoro-n-butanesulfonate, 4-nitro-1-naphthyldimethylsulfonium perfluoro-n-octanesulfonate, 4-nitro-1-naphthyldiethylsulfonium trifluoromethanesulfonate, 4-nitro-1-naphthyldiethylsulfonium nonafluoro-n-butanesulfonate, and 4-nitro-1-naphthyldiethylsulfonium perfluoro-n-octanesulfonate.

Halogen-Containing Compound:

As examples of the halogen-containing compound, haloalkyl group-containing hydrocarbon compounds, and haloalkyl group-containing heterocyclic compounds can be given.

As specific examples of the halogen-containing compound, (trichloromethyl)-s-triazine derivatives such as phenylbis(trichloromethyl)-s-triazine, 4-methoxyphenylbis(trichloromethyl)-s-triazine, 1-naphthylbis(trichloromethyl)-s-triazine, and 1,1-bis(4-chlorophenyl)-2,2,2-trichloroethane can be given.

Diazoketone Compound:

As examples of the diazoketone compound, 1,3-diketo-2-diazo compounds, diazobenzoquinone compounds, and diazonaphthoquinone compounds can be given.

As specific examples of the diazoketone compound, 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, and 1,2-naphthoquinonediazido-4-sulfonate or 1,2-naphthoquinonediazido-5-sulfonate of 1,1,1-tris(4-hydroxyphenyl)ethane can be given.

Sulfone Compound:

As examples of the sulfone compound, β-ketosulfone, β-sulfonylsulfone, and α-diazo compounds of these compounds can be given.

As specific examples of the sulfone compound, 4-trisphenacylsulfone, mesitylphenacylsulfone, bis(phenylsulfonyl)methane, and the like can be given.

Sulfonic Acid Compound:

As examples of the sulfonic acid compound, alkyl sulfonate, alkylimide sulfonate, haloalkyl sulfonate, aryl sulfonate, and imino sulfonate can be given.

As specific examples of the sulfone compound, benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimide trifluoromethanesulfonate, N-hydroxysuccinimide nonafluoro-n-butanesulfonate, N-hydroxysuccinimide perfluoro-n-octanesulfonate, 1,8-naphthalenedicarboxylic acid imide trifluoromethanesulfonate, 1,8-naphthalenedicarboxylic acid imide nonafluoro-n-butanesulfonate, and 1,8-naphthalenedicarboxylic acid imide perfluoro-n-octanesulfonate can be given.

These other acid generators may be used either individually or in combination of two or more.

In the present invention, the amount of the acid generator (B) is usually 0.1–20 parts by weight, and preferably 0.5–10 parts by weight for 100 parts by weight of the resin (A) in order to ensure sensitivity and developability of the resist. If the amount of the acid generator (B) is less than 0.1 part by weight, sensitivity and developability of the resulting resist may be decreased. If the amount exceeds 20 parts by weight, it may be difficult to obtain a rectangular resist pattern due to a decrease in transparency to radiation.

The amount of the acid generator (B-2) to the amount of the acid generator (B-1), [acid generator (B-2)]×100/acid generator (B-1)], is preferably 1–50 wt %, and more preferably 5–30 wt %.

The proportion of the other acid generators to be added is 80 wt % or less, and preferably 60 wt % or less of the total amount of acid generators used.

Additives

Various types of additives such as acid diffusion controllers, alicyclic additives having an acid-dissociating group, surfactants, and sensitizers may optionally be added to the radiation-sensitive resin composition of the present invention.

The acid diffusion controller controls the diffusion phenomenon of an acid generated from the acid generator (B) upon exposure in the resist film, thereby hindering undesired chemical reactions in the unexposed area.

Addition of the acid diffusion controller further improves storage stability of the resulting radiation-sensitive resin composition and resolution of the resist. Moreover, addition of the acid diffusion controller prevents the line width of the resist pattern from changing due to changes in the post-exposure delay (PED) between exposure and development, whereby a composition with remarkably superior process stability can be obtained.

As the acid diffusion controller, nitrogen-containing organic compounds of which the basicity does not change due to exposure or heat treatment during formation of a resist pattern are preferable.

As examples of such a nitrogen-containing organic compound, compounds shown by the following formula (14) (hereinafter called "nitrogen-containing compounds (a)"), compounds having two nitrogen atoms in the molecule (hereinafter called "nitrogen-containing compounds (b)"), polyamino compounds or polymers having three or more nitrogen atoms (hereinafter collectively called "nitrogen-containing compounds (c)"), amide group-containing compounds, urea compounds, and nitrogen-containing heterocyclic compounds can be given:

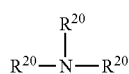

(14)

wherein $R^{20}$ individually represents a hydrogen atom, a substituted or unsubstituted, linear, branched, or cyclic alkyl group, substituted or unsubstituted aryl group, or substituted or unsubstituted aralkyl group.

As examples of the nitrogen-containing compound (a), mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; and aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine can be given.

Examples of the nitrogen-containing compound (b) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis (4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, and bis(2-diethylaminoethyl)ether.

As examples of the nitrogen-containing compound (c), polyethyleneimine, polyallylamine, and a polymer of 2-dimethylaminoethylacrylamide can be given.

As examples of the amide group-containing compound, N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, and N-methylpyrrolidone can be given.

As examples of the urea compound, urea, methylurea, 1,1-dimethylurea, 1,3-dimethylurea, 1,1,3,3-tetramethylurea, 1,3-diphenylurea, and tri-n-butylthiourea can be given. Examples of the nitrogen-containing heterocyclic compounds include imidazoles such as imidazole, benzimidazole, 4-methylimidazole, 4-methyl-2-phenylimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, and 1-(2-hydroxyethyl) piperazine; and pyrazine, pyrazole, pyridazine, quinoxaline, purine, pyrrolidine, piperidine, 3-piperidino-1,2-propanediol, morpholine, 4-methylmorpholine, 1,4-dimethylpiperazine, and 1,4-diazabicyclo[2.2.2]octane.

Of these nitrogen-containing organic compounds, the nitrogen-containing compounds (a), amide-containing compounds, and nitrogen-containing heterocyclic compounds are preferable.

The acid diffusion controllers may be used either individually or in combination of two or more.

The alicyclic additives having an acid-dissociable group improve dry etching resistance, pattern shape, and adhesion to the substrate.

Examples of such alicyclic additives include: adamantane derivatives such as t-butyl 1-adamantanecarboxylate, t-butoxycarbonylmethyl 1-adamantanecarboxylate, di-t-butyl 1,3-adamantanedicarboxylate, t-butyl 1-adamantaneacetate, t-butoxycarbonylmethyl 1-adamantaneacetate, and di-t-butyl 1,3-adamantanediacetate; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; and lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate.

These alicyclic additives may be used either individually or in combination of two or more.

The surfactants improve applicability, striation, developability, and the like.

As examples of the surfactant, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; and commercially available products such as KP341 (manufactured by Shin-Etsu Chemical Co., Ltd.), POLYFLOW No. 75, No. 95 (manufactured by Kyoeisha Chemical Co., Ltd.), FTOP EF301, EF303, EF352 (manufactured by Tohkem Products Corporation), MEGAFAC F171, F173 (manufactured by Dainippon Ink and Chemicals, Inc.), Fluorad FC430, FC431 (manufactured by Sumitomo 3M Ltd.), Asahi Guard AG710, and Surflon S-382, SC-101, SC-102, SC-103, SC-104, SC-105, SC-106 (manufactured by Asahi Glass Co., Ltd.) can be given.

The surfactants may be used either individually or in combination of two or more.

The sensitizers absorb radiation energy and transmit the energy to the acid generator (B), thereby increasing the amount of an acid generated upon exposure. The sensitizers improve apparent sensitivity of the radiation-sensitive resin composition.

As examples of the sensitizer, acetophenones, benzophenones, naphthalenes, biacetyl, Eosine, Rose Bengal, pyrenes, anthracenes, and phenothiazines can be given.

These sensitizers may be used either individually or in combinations of two or more. Addition of a dye or a pigment visualizes a latent image in the exposed area, thereby decreasing the effects of halation during exposure. Use of an adhesion improver improves adhesion to the substrates.

As other additives, alkali-soluble resins described later, low molecular weight alkali solubility controllers containing an acid dissociable protecting group, halation inhibitors, preservation stabilizers, antifoaming agents, and the like can be given.

Preparation of Composition Solution

The radiation-sensitive resin composition of the present invention is made into a composition solution by dissolving the composition in a solvent so that the total solid content is usually 5–50 wt %, and preferably 10–25 wt %, and filtering the solution using a filter with a pore diameter of about 0.2 μm, for example.

As examples of solvents used for preparation of the composition solution, linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxyproprionates such as methyl 2-hydroxyproprionate, ethyl 2-hydroxyproprionate, n-propyl 2-hydroxyproprionate, i-propyl 2-hydroxyproprionate, n-butyl 2-hydroxyproprionate, i-butyl 2-hydroxyproprionate, sec-butyl 2-hydroxyproprionate, and t-butyl 2-hydroxyproprionate; alkyl 3-alkoxypropionates such as methyl 3-methoxypropionate, ethyl 3-methoxypropionate, methyl 3-ethoxypropionate, and ethyl 3-ethoxypropionate; as well as other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methylpropionate, ethyl ethoxyacetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate can be given.

These solvents may be used either individually or in combination of two or more. Among these solvents, linear or branched ketones, cyclic ketones, propylene glycol monoalkyl ether acetates, alkyl 2-hydroxypropionates, and alkyl 3-alkoxypropionates are preferable.

Formation of Resist Patterns

In the radiation-sensitive resin composition of the present invention, an acid-dissociable group in the resin (A) dissociates by the action of an acid generated from the acid generator (B) upon exposure, thereby producing a hydroxyl group or a carboxyl group. As a result, solubility of the exposed part of the resist film in an alkaline developer increases, whereby the exposed part is dissolved in an alkaline developer and removed to obtain a positive-tone resist pattern.

A resist pattern is formed from the radiation-sensitive resin composition of the present invention by applying the composition solution to, for example, substrates such as a silicon wafer and a wafer coated with aluminum using an appropriate application method such as rotational coating, cast coating, and roll coating to form a resist film. The resist film is then optionally pre-baked (hereinafter called "PB") and exposed to form a predetermined resist pattern. As radiation used for exposure, visible rays, ultraviolet rays, deep ultraviolet rays, X-rays, electron beams, or the like is appropriately selected, with particularly preferable radiations being deep ultraviolet rays typified by an ArF excimer laser (wavelength 193 nm).

In the present invention, it is preferable to perform post-exposure bake (hereinafter called "PEB"). PEB ensures smooth dissociation of the acid-dissociable group in the resin (A). The heating temperature for the PEB is usually 30–200° C., and preferably 50–170° C., although the heating conditions are changed depending on the composition of the radiation-sensitive resin composition.

In order to bring out maximum potentiality of the radiation-sensitive resin composition of the present invention, an organic or inorganic anti-reflection film may be formed on a substrate as disclosed in Japanese Patent Publication No.1994-12452, for example. Moreover, a protection film may be formed on the resist film as disclosed in Japanese Patent Application Laid-open No. 1993-188598, for example, in order to prevent the effects of basic impurities and the like in an environmental atmosphere. These techniques may be employed in combination.

The exposed resist film is then developed to form a specific resist pattern.

As examples of the developer used for development, alkaline aqueous solutions prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diazabicyclo-[4.3.0]-5-nonene are preferable.

The concentration of the alkaline aqueous solution is usually 10 wt % or less. If the concentration of the alkaline aqueous solution exceeds 10 wt %, an unexposed part may be dissolved in the developer.

Organic solvents or the like may be added to the developer containing an alkaline aqueous solution.

As examples of the organic solvent, linear, branched, or cyclic ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, and dimethylformamide can be given.

These organic solvents may be used either individually or in combination of two or more.

The amount of the organic solvent to be used is preferably 100 vol % or less of the alkaline aqueous solution. If the amount of the organic solvent exceeds 100 vol %, developability tends to decrease.

In addition, surfactants or the like may be added to the developer containing the alkaline aqueous solution in an appropriate amount.

After development using the alkaline aqueous solution developer, the resist film is generally washed with water and dried.

EXAMPLES

The present invention is described below in more detail by examples. However, these examples should not be construed as limiting the present invention. In the examples, "part" refers to "part by weight" unless otherwise indicated.

Measurement and evaluation in the examples and comparative examples were carried out according to the following procedures.

Mw:

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene Sensitivity:

A solution composition was applied to a silicon wafer with a 82 nm thickness ARC25 film (manufactured by Brewer Science Corp.) coated on the surface by spin coating and post-baked on a hot plate at 130° C. for 90 seconds to obtain a resist coating with a thickness of 0.4 µm. The coating was exposed to radiation through a mask pattern using an ArF excimer laser exposure apparatus (manufactured by Nikon Corp., lens numerical aperture: 0.55, wavelength: 193 nm). After performing PEB on a hot plate at 130° C. for 90 seconds, the resist films were developed in a 2.38 wt % tetramethylammonium hydroxide aqueous solution at 23° C. for 1 minute, washed with water, and dried to form a positive-tone resist pattern. An optimum dose capable of forming a 1:1 line width from a line-and-space pattern with a design line width of 0.18 µm (pitch 0.36 µm) was taken as a standard of sensitivity.

Resolution:

Minimum dimensions of the resist pattern resolved at the optimum dose were taken as the resolution.

Pattern Shape:

The dimensions of the upper side $L_a$ and the lower side $L_b$ of the cross-section of a line-and-space pattern (1L1S) with a line width of 0.18 µm were measured using a scanning electron microscope. A pattern shape that satisfied the formula "$0.85 \leq L_a/L_b \leq 1$" and did not draw a skirt was evaluated as "Good", a pattern shape satisfying the formula "$0.85 > L_a/L_b$" was evaluated as "Tapered", and a pattern shape satisfying the formula "$1 < L_a/L_b$" was evaluated as "Inversely Tapered".

<Preparation of Resin (A)>

Synthesis Example 1

A monomer solution was prepared by dissolving 50.55 g (50 mol %) of 2-methyl-2-adamantly methacrylate, 25.49 g (25 mol %) of 3-hydroxy-1-adamantyl methacrylate, and 23.97 g (25 mol %) of a compound having the following formula (15) (hereinafter referred to as "methacrylate (α)"), and 3.97 g of methyl azobisisolactate in 200 g of 2-butanone.

A 1,000 ml three-necked flask containing 100 g of 2-butanone was purged with nitrogen for 30 minutes and heated to 80° C. while stirring. Then, the above monomer solution was added to the flask using a dripping funnel at a rate of 10 ml/5 min. The polymerization reaction was carried out for five hours after initiation of dripping. After the polymerization, the polymer solution was cooled with water to 30° C. or lower and poured into 2,000 g of methanol. White precipitate produced was collected by filtration. The white powder collected by filtration was washed twice with 400 g of methanol, again filtered, and dried for 17 hours at 50° C. to obtain 73 g of a white resin powder (yield: 73 wt %).

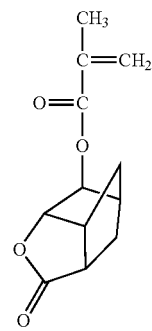

(15)

This resin was a copolymer with a molecular weight of 10,000 and a mol % ratio of the recurring units derived from 2-methyl-2-adamantyl methacrylate, 3-hydroxy-1-adamantyl methacrylate, and the methacrylate (α) of 45.3:25.1:29.6 (mol %). This resin is referred to as a "resin (A-1)".

Synthesis Example 2

71 g (yield 71 wt %) of a white resin powder was prepared in the same manner as in Synthesis Example 1, except for using a monomer solution which was prepared by dissolving 50.85 g (50 mol %) of 2-methyl-2-adamantly methacrylate, 15.39 g (15 mol %) of 3-hydroxy-1-adamantyl methacrylate, 33.76 g (35 mol %) of the methacrylate (α), and 4.00 g of methyl azobisisolactate in 200 g of 2-butanone.

This resin was a copolymer with an Mw of 10,500 and a mol % ratio of the recurring units derived from 2-methyl-2-adamantyl methacrylate, 3-hydroxy-1-adamantyl methacrylate, and the methacrylate (α) of 46.2:15.6:38.2 (mol %). This resin is referred to as a "resin (A-2)".

Synthesis Example 3

73 g (yield 73 wt %) of a white resin powder was prepared in the same manner as in Synthesis Example 1, except for using a monomer solution which was prepared by homogeneously dissolving 40.90 g (40 mol %) of 2-methyl-2-adamantly methacrylate, 15.47 g (15 mol %) of 3-hydroxy-1-adamantyl methacrylate, 43.64 g (45 mol %) of the methacrylate (α) in 200 g of 2-butanone, and by adding 4.02 g of methyl azobisisolactate.

This resin was a copolymer with an Mw of 9,200, having a copolymerization ratio of 2-methyl-2-adamantyl methacrylate:3-hydroxy-1-adamantyl methacrylate: the compound of the formula (34)=36.2:15.2:48.6.

This resin is referred to as a "resin (A-3)".

Synthesis Example 4

62 g (yield 62 wt %) of a white resin powder was prepared in the same manner as in Synthesis Example 1, except for using a monomer solution which was prepared by homogeneously dissolving 47.76 g (45 mol %) of 2-ethyl-2-adamantyl methacrylate and 52.24 g (55 mol %) of the methacrylate (α) in 200 g of 2-butanone, and by adding 3.93 g of methyl azobisisolactate.

This resin was a copolymer with an Mw of 11,600, having a copolymerization mol ratio of 2-ethyl-2-adamantyl methacrylate:methacrylate (α)=39.8:60.2.

This resin is referred to as a "resin (A-4)".

<Preparation of Acid Generator (B-1)>

Synthesis Example 5

A stirring rod was placed in a fully dried eggplant type flask (100 ml). The flask was charged with 3.00 g of 1-n-butoxynaphthalene and 8.9 g of diphosphorus pentaoxide-methanesulfonic acid. The mixture was stirred at 0° C. while cooling in an ice bath. After the addition of 1.88 g of tetramethylene sulfoxide dropwise to the reaction mixture over five minutes or more, the mixture was stirred at 0° C. for 10 minutes. After removing the flask from the ice bath, the mixture was stirred at 45° C. for four hours. The reaction mixture was cooled to 0° C. in an ice bath. 25 ml of ion-exchanged water and 6.85 g of 25 wt % aqueous ammonia were added to adjust the pH of the reaction mixture to 7. After removing the flask from the ice bath, the mixture was stirred at 25° C. for one hour. Insoluble components were filtered.

An aqueous solution of lithium bis(nonafluoro-n-buthanesulfonyl)imidate prepared by mixing 10.44 g of bis(nonafluoro-n-buthanesulfonyl)imide, 0.67 g of lithium carbonate, and 15 ml of ion-exchanged water was added to the resulting filtrate at room temperature. The mixture was stirred at 25° C. for five hours. The resulting white precipitate was filtered and thoroughly washed with ion-exchanged water. The precipitate was dried under vacuum to obtain 5.54 g of 1-(4-n-butoxynaphthalen-1-yl)tetrahydrothiophenium bis(nonafluoro-n-buthanesulfonyl)imidate. This compound is referred to as "acid generator (B1-4)".

Examples 1–6 and Comparative Examples 1–3

Various items were evaluated for each composition solution having components shown in Table 1. The evaluation results are shown in Table 2. Components other than the resin (A-1), resin (A-2), and acid generator (B1-4) shown in Table 1 are as follows.

Acid Generator (B)
B1-1: 1-(3,5-dimethyl-4-hydroxyphenyl)tetrahydrothiopheniumperfluoro-n-octanesulfonate
B1-2: 1-(3,5-dimethyl-4-hydroxyphenyl)tetrahydrothiopheniumnonafluoro-n-butanesulfonate
B1-3: 1-(4-n-butoxynaphthalen-1-yl)tetrahydrothiophenium nonafluoro-n-butanesulfonate
B1-4: 1-(4-n-butoxynaphthalen-1-yl)tetrahydrothiophenium perfluoro-n-octanesulfonate
B2-1: triphenylsulfonium nonafluoro-n-butanesulfonate
B3-1: bis(t-butylphenyl)iodonium nonafluoro-n-butanesulfonate
B3-2: triphenylsulfonium trifluoromethanesulfonate Acid Diffusion Controller
Q-1: N-t-butoxycarbonyldicyclohexylamine
Q-2: 2-phenylbenzimidazole
Q-1: N-t-butoxycarbonyl-2-phenylbenzimidazole Other Additives
L-1: t-butoxycarbonylmethyl deoxycholate Solvent
S-1: 2-heptanone/γ-butyrolactone=9/1 (weight ratio)
S-2: 2-heptanone
S-3: propylene glycol monomethyl ether acetate:γ-butyrolactone=95:5 (weight ratio)

TABLE 1

|  | Resin (part) | Acid generator (part) | Acid diffusion controller (part) | Other additives | Solvent (part) |
|---|---|---|---|---|---|
| Example 1 | A-1 (100) | B1-1/B2-1 (4/1) | Q-1 (0.18) | — | S-1 (600) |
| Example 2 | A-1 (100) | B1-2/B2-1 (4/1) | Q-2 (0.24) | — | S-2 (600) |
| Example 3 | A-1 (100) | B1-3/B2-1 (4/1) | Q-2 (0.22) | — | S-2 (600) |
| Example 4 | A-1 (100) | B1-4/B2-1 (4/1) | Q-3 (0.21) | — | S-2 (600) |

TABLE 1-continued

| | Resin (part) | Acid generator (part) | Acid diffusion controller (part) | Other additives | Solvent (part) |
|---|---|---|---|---|---|
| Example 5 | A-1 (100) | B1-2/B2-1 (4/0.5) | Q-2 (0.22) | L-1 (5) | S-2 (600) |
| Example 6 | A-2 (100) | B-2/B2-1 (4/1) | Q-2 (0.24) | — | S-2 (600) |
| Example 7 | A-3 (100) | B1-3/B2-1 (4/1) | Q-2 (0.20) | — | S-3 (600) |
| Example 8 | A-3 (90) A-4 (10) | B1-3/B2-1 (4/1) | Q-2 (0.20) | — | S-3 (600) |
| Example 9 | A-3 (90) A-4 (10) | B1-3/B2-1 (4/1) | Q-2 (0.20) | — | S-3 (600) |
| Example 10 | A-3 (100) | B1-3/B1-4/B2-1 (2/2/1) | Q-2 (0.20) | — | S-3 (600) |
| Comparative Example 1 | A-1 (100) | B1-2 (5) | Q-1 (0.26) | — | S-1 (600) |
| Comparative Example 2 | A-1 (100) | B2-1 (2) | Q-1 (0.07) | — | S-1 (600) |
| Comparative Example 3 | A-1 (100) | B1-2/B3-1 (4/1) | Q-1 (0.21) | — | S-1 (600) |
| Comparative Example 4 | A-1 (100) | B1-2/B3-2 (4/1) | Q-1 (0.21) | — | S-1 (600) |

TABLE 2

| | Sensitivity (J/m$^2$) | Resolution (μm) | Pattern form |
|---|---|---|---|
| Example 1 | 500 | 0.14 | Good |
| Example 2 | 440 | 0.14 | Good |
| Example 3 | 460 | 0.14 | Good |
| Example 4 | 460 | 0.14 | Good |
| Example 5 | 320 | 0.14 | Good |
| Example 6 | 340 | 0.14 | Good |
| Example 7 | 480 | 0.14 | Good |
| Example 8 | 370 | 0.14 | Good |
| Example 9 | 360 | 0.14 | Good |
| Example 10 | 450 | 0.14 | Good |
| Comparative Example 1 | 520 | 0.16 | Inversely tapered |
| Comparative Example 2 | 370 | 0.16 | Tapered |
| Comparative Example 3 | 410 | 0.16 | Tapered |
| Comparative Example 4 | 250 | 0.16 | Tapered |

INDUSTRIAL APPLICABILITY

The radiation-sensitive resin composition of the present invention exhibits excellent sensitivity and resolution to deep ultraviolet rays typified by an ArF excimer laser (wavelength: 193 nm) and possesses superior basic properties as a resist such as producing a pattern shape. The resin composition is extremely useful for manufacturing integrated circuit elements which are anticipated to be more and more downsized in the future.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:
(A) a resin comprising a hydroxyl group or carboxyl group, of which the hydrogen atom has been replaced by an acid-dissociable group possessing an alkali dissolution controlling capability, wherein the acid-dissociable group dissociates by the action of an acid generated by irradiation and increases the solubility of the resin in an alkaline aqueous solution and
(B) a photoacid generator, which comprises a compound (B-1) shown by the following formula (1),

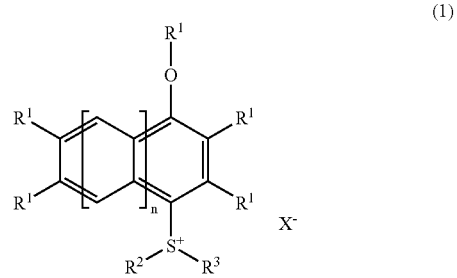

(1)

wherein the groups $R^1$ individually represent a hydrogen atom or a linear or branched alkyl group having 1–4 carbon atoms, n is 0 or 1, $R^2$ and $R^3$ individually represents a hydrogen atom, a linear or branched alkyl group having 1–4 carbon atoms, or $R^2$ and $R^3$ bond together with the sulfur atom in the formula to form a 3–6 member cyclic structure, and $X^-$ represents a disulfonylimide acid anion represented by the following formula (i),

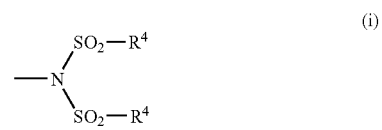

(i)

wherein each $R^4$ groups individually represent a linear or branched fluoroalkyl group having 1–15 carbon atoms, and a compound (B-2) shown by the following formula (2),

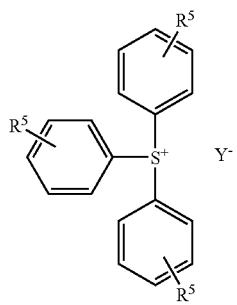
(2)

wherein the groups $R^5$ individually represent a hydrogen atom, a hydroxyl group or a derivative thereof, or a linear or branched alkyl group having 1–4 carbon atoms and $Y^-$ represents a substituted or unsubstituted, linear or branched fluoroalkyl sulfonic acid anion having 2–15 carbon atoms.

2. The radiation sensitive resin composition according to claim 1, wherein the component (A) comprises (A-1) a recurring unit originating from a (meth)acrylate having an acid-dissociable group and (A-2) a recurring unit originating from a (meth)acrylate having a lactone structure.

3. The radiation-sensitive resin composition according to claim 1, wherein the content of the component (B-2) is 5–30 wt % of the component (B-1).

4. The radiation-sensitive resin composition according to claim 1, wherein the component (B-1) is a compound having the $R^2$ and $R^3$ groups bonded with the sulfur atom to form a tetrahydrothiophene ring in the formula (1).

5. The radiation-sensitive resin composition according to claim 1, wherein the component (B-2) is a compound having $C_4F_9SO_3^-$ or $C_8F_{17}SO_3^-$ for $Y^-$ in the formula (2).

* * * * *